United States Patent
Wu et al.

(10) Patent No.: US 11,967,661 B1
(45) Date of Patent: Apr. 23, 2024

(54) SOLAR PANEL DESIGN AND METHODS FOR MAGNETIC CLEANLINESS

(71) Applicant: Ball Aerospace & Technologies Corp., Boulder, CO (US)

(72) Inventors: Gordon Wu, Lafayette, CO (US); Derek Chan, Boulder, CO (US); Jennifer Atteberry, Longmont, CO (US)

(73) Assignee: BAE Systems Space & Mission Systems Inc., Broomfield, CO (US)

( * ) Notice: Subject to any disclaimer, the term of this patent is extended or adjusted under 35 U.S.C. 154(b) by 0 days.

(21) Appl. No.: 17/585,070

(22) Filed: Jan. 26, 2022

Related U.S. Application Data

(60) Provisional application No. 63/142,237, filed on Jan. 27, 2021.

(51) Int. Cl.
  *H01L 31/05* (2014.01)
(52) U.S. Cl.
  CPC ............................... *H01L 31/0508* (2013.01)
(58) Field of Classification Search
  CPC .................................................. H01L 31/0508
  See application file for complete search history.

(56) References Cited

U.S. PATENT DOCUMENTS

| | | | |
|---|---|---|---|
| 3,419,433 A * | 12/1968 | Slifer, Jr. | B64G 1/443 174/32 |
| 9,748,432 B2 | 8/2017 | Clevenger et al. | |
| 10,418,933 B2 | 9/2019 | France et al. | |
| 2008/0143292 A1 | 6/2008 | Ward | |
| 2008/0210294 A1 * | 9/2008 | Moslehi | G03G 21/203 257/E27.125 |
| 2010/0116325 A1 | 5/2010 | Nikoonahad | |
| 2011/0061709 A1 | 3/2011 | Payan | |
| 2012/0024342 A1 * | 2/2012 | Kalman | H02S 40/36 136/245 |
| 2015/0333200 A1 * | 11/2015 | Chirila | C23C 14/24 118/715 |
| 2018/0076339 A1 | 3/2018 | Rehder | |
| 2018/0097133 A1 | 4/2018 | Anthony et al. | |
| 2020/0202404 A1 | 6/2020 | Clevenger | |
| 2020/0328318 A1 | 10/2020 | Emerson | |

OTHER PUBLICATIONS

Vaccaro et al. "Integrated solar panel antennas," Electronics Letters, 2000, vol. 36, No. 5, pp. 390-391.

* cited by examiner

*Primary Examiner* — Angelo Trivisonno
(74) *Attorney, Agent, or Firm* — Sheridan Ross P.C.

(57) ABSTRACT

Systems and methods for providing a solar cell array with a reduced magnetic field are provided. The systems include a plurality of solar cells arrayed on a first surface side of a substrate. The solar cells are electrically connected to one another in series by a first conductor structure at least partially disposed on the first surface side of the substrate, forming a solar cell or supply circuit. A second conductor structure in series with the solar cell circuit is at least partially disposed on the second surface side of the substrate, forming a return harness. The supply circuit and the return harness define current paths that are opposite one another, and that are separated from one another by the substrate. The first and second conductor structures can be formed from conductive traces on the first and second sides respectively of the substrate.

19 Claims, 7 Drawing Sheets

SOLAR PANEL DESIGN AND METHODS FOR MAGNETIC CLEANLINESS

CROSS-REFERENCE TO RELATED APPLICATIONS

This application claims the benefit of U.S. Provisional Patent Application Ser. No. 63/142,237, filed Jan. 27, 2021, the entire disclosure of which is hereby incorporated herein by reference.

FIELD

Systems and methods for configuring a solar panel in order to reduce a generated magnetic field are provided.

BACKGROUND

Arrays of solar panels are an increasingly important source of electrical power, particularly in connection with platforms that are deployed remotely. For example, solar arrays are commonly deployed as part of spacecraft, such as but not limited to satellites, to provide some or all of the electrical power required to operate various spacecraft systems and instruments. In a typical implementation, an array consisting of multiple solar cells or elements is disposed across a surface provided by a structural element. The current generated within the solar cells creates magnetic fields, which can interfere with the operation of sensitive instruments also carried by the platform.

In order to mitigate the effect of the magnetic fields, instruments that are sensitive to such fields can be placed at a distance from the solar array. However, this has the effect of adding complexity and weight to the platform structure. Alternatively or in addition, current paths through the array of solar cells can be configured to at least partially cancel the magnetic fields generated within the array. For example, the geometry and orientation of solar cell circuits can be selected to achieve some reduction in generated magnetic fields. In addition, a conductor or conductors forming an electrical harness connected in series to the array of solar cells on a side of the structural member can be routed on a side of the structural member opposite to the side on which the array of solar cells is mounted. More particularly, the conductors can be routed to mirror current paths through the array of solar cells, and so that current flows through the harness in the opposite direction as in opposing portions of the paths through the array of solar cells. However, the spacing between the array of solar cells and the wiring of the harness is relatively large due to the thickness of the structural panel, reducing the amount by which the magnetic field can be canceled. In addition, the complexity of the current paths through the array, which can include hundreds or even thousands of individual solar cell circuits, variability in the power demanded by equipment on the platform, variability in the power generated by the solar array, and the like, have made such solutions less than ideal. Moreover, such solutions have typically required a significant amount of complex, non-recurring engineering to design suitable cancellation designs, and the implementation of such designs has required manually routing of the conductor or conductors. As a result, measures to cancel magnetic fields generated in solar arrays are seldom implemented.

Accordingly, it would be desirable to provide systems and methods that enable the reduction or minimization of magnetic fields generated in a solar cell array, while avoiding complexity and increased production costs.

SUMMARY

Systems and methods for providing a solar cell array with a reduced magnetic field are provided. The systems include a solar cell array with a circuit substrate and a plurality of solar cells arrayed on a first surface side of the substrate. The solar cells are electrically connected to one another in series by a first conductor structure or first set of electrically conductive elements that includes a first set of traces, forming a solar cell or supply circuit. A second conductor structure or second set of electrically conductive elements, in series with the solar cell circuit, is disposed on the second surface side of the substrate, forming a magnetic field cancellation return harness. The supply circuit and the return harness define current paths that are adjacent and opposite one another, and that are separated from one another by the substrate. One or more subarrays can be mounted to a support structure and the resulting solar panel can be deployed and operated to generate electrical power, while producing reduced or suppressed magnetic fields in areas external to the solar panel.

In accordance with embodiments of the present disclosure, solar cells included in a solar cell array are mounted on a first side of a thin substrate material to form the array. The substrate includes conductors on the first side of the substrate interconnecting the solar cells, forming at least portions of a supply harness. The substrate also includes conductors formed on an internal layer or layers, and/or on a second side of the substrate that is opposite the first side, forming a return harness. Embodiments of the present disclosure allow the return harness to be formed using automated processes, without requiring manual routing of wiring. In addition, it allows the conductors of the return harness to be placed in close proximity to the current paths through the array of solar cells. As a result, effective cancellation of magnetic fields can be achieved. Moreover, the magnetic field cancellation return harness can be implemented relatively easily and economically.

Methods in accordance with embodiments of the present disclosure include disposing a plurality of solar cells as one or more arrays on a surface of a substrate having integral circuit features. In particular, conductive traces are provided on a first surface of the substrate, to which terminals of solar cells can be connected, directly or through intermediate wirings. The conductive traces, current paths internal to the solar cells, and intermediate wirings (if included) can all be used to form a supply circuit portion of a current path. In addition, conductive traces are provided on a second surface of the substrate, within an intermediate layer of the substrate, or both, to form a return circuit portion of the current path that mirrors the supply circuit portion of the current path. In accordance with at least some embodiments of the present disclosure, the various conductive traces, vias, and the like are formed on a multilayered circuit board using conventional automated manufacturing techniques.

Additional features and advantages of embodiments of the present disclosure will become more readily apparent from the following description, particularly when considered together with the accompanying drawings.

DETAILED DESCRIPTION

Figure 1:
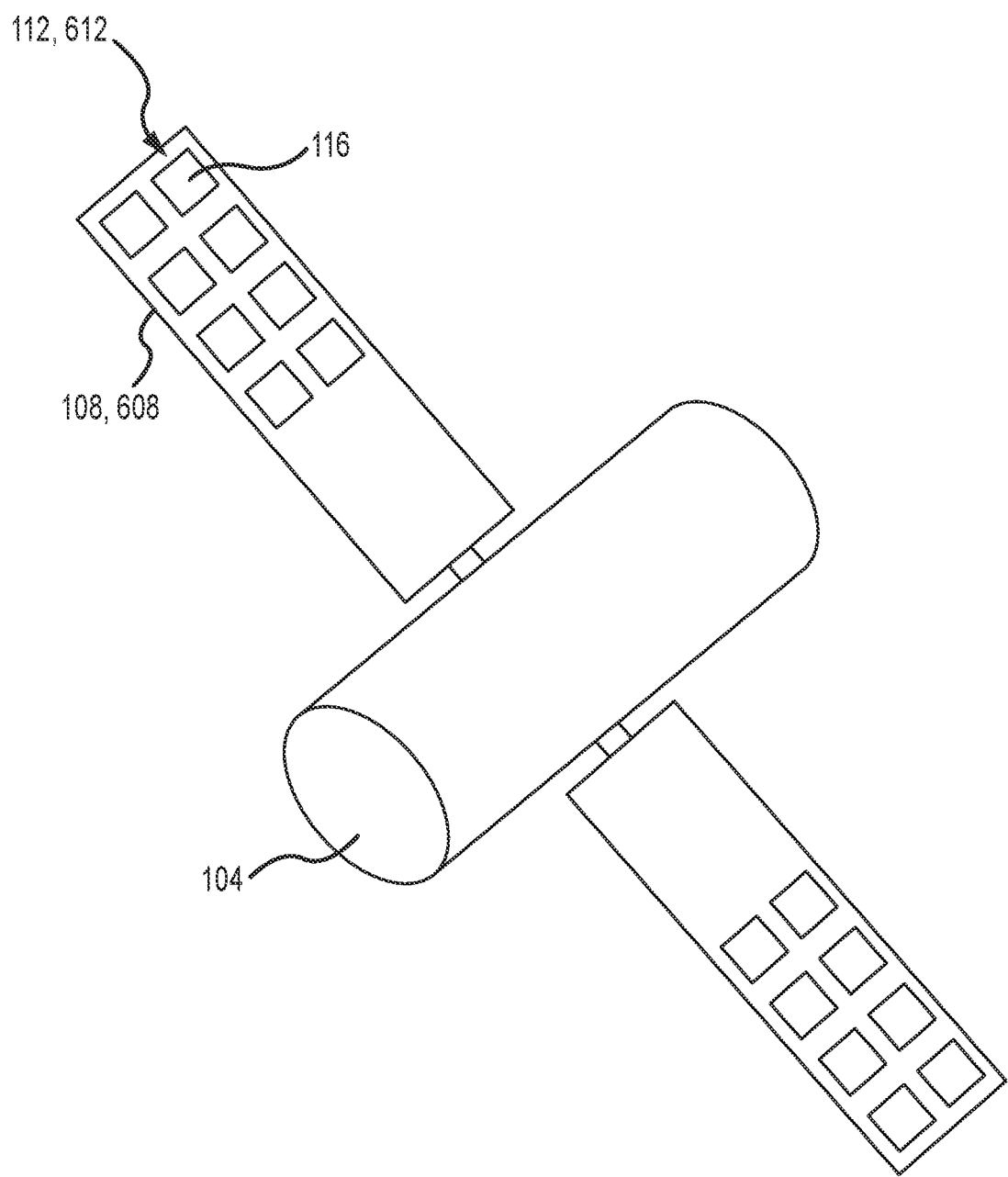
FIG. 1 depicts a spacecraft and associated solar cell arrays in accordance with embodiments of the present disclosure.

FIG. 1 depicts a platform 104 having associated solar panels or solar panel assemblies 108 or 608. Moreover, the solar panels 108 or 608 can include one more solar cell arrays 112 or 612, each having a plurality of interconnected solar cells 116, that are configured in accordance with embodiments of the present disclosure. As can be appreciated by one of skill in the art after consideration of the present disclosure, a solar cell 116 can itself include an assembly or module having any number of photodiodes or other elements formed in or on a substrate that convert light into electric charge through the photovoltaic effect. In the illustrated example, the platform 104 is depicted as a spacecraft. However, it should be appreciated that embodiments of the present disclosure are not so limited. In particular, a solar panel assembly 108 or 608 incorporating one or more solar cell arrays 112 can be deployed with or as part of any type of platform or installation. Moreover, solar panel assemblies 608 in accordance with embodiments of the present disclosure can generate electrical power while suppressing or eliminating the presence of magnetic fields, making solar panel assemblies as described herein particularly well-suited to use in connection with a platform or installation that is also carrying or associated with instruments or other componentry that is sensitive to the presence of magnetic fields.

Figure 2:
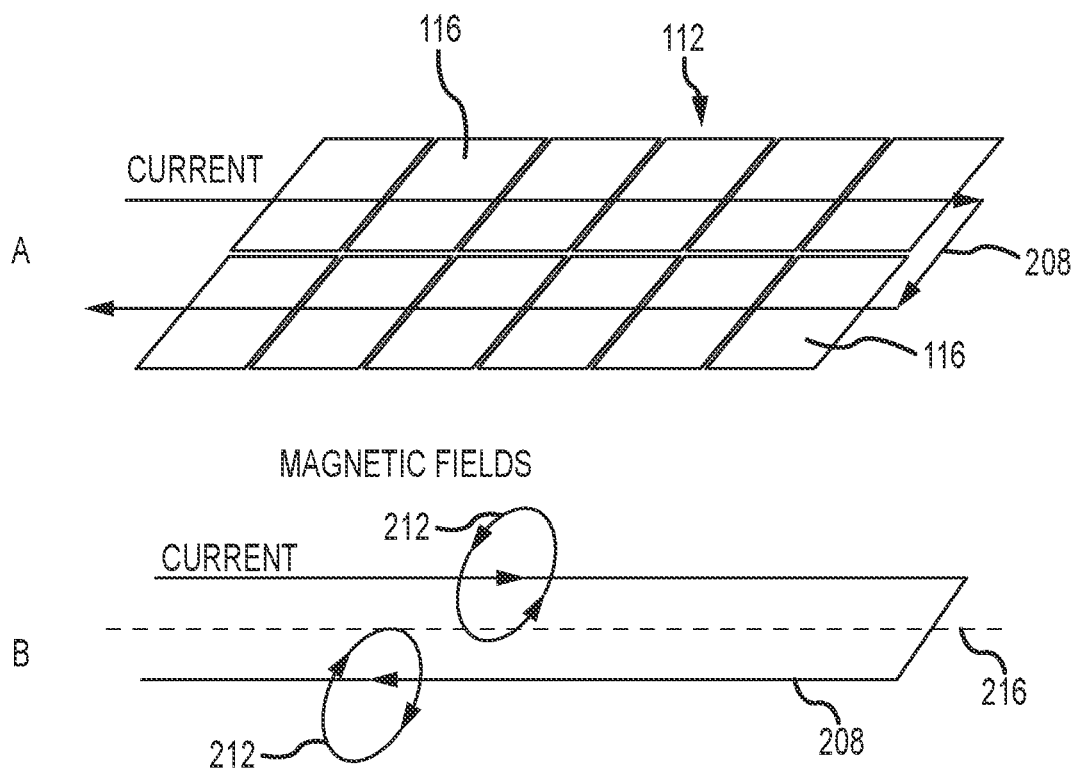
FIG. 2 depicts current paths and associated magnetic fields in a solar cell array configured according to an exemplary configuration.

FIG. 2 depicts current paths and associated magnetic fields in a solar cell array 112 configured according to an exemplary configuration. In general, the solar cell array 112 includes a plurality of solar cells 116 that are disposed in one or more rows and columns to form a two-dimensional array. As can be appreciated by one of skill in the art, a solar or photovoltaic cell 116 generates an electrical charge in response to receiving energy in the form of light. Although the terms solar cell array and solar cell are used herein, it should be appreciated that embodiments of the present invention are not limited to the production of electrical power from sunlight. A solar cell array 112 can include any number of individual solar cells 116. In a typical configuration, the solar cells 116 in a solar cell array 112 are connected to one another in series. For instance, as depicted in A of FIG. 2, the current path 208 through an operating solar cell array 112 (i.e. a solar cell array 112 that is operating to produce an electrical current) can travel along a first row of solar cells 116 from left to right, can pass across to a second row of solar cells 116 once the end of the first row is reached, and then travel along the second row from right to left.

As can be appreciated by one of skill in the art after consideration of the present disclosure, electrical current travelling along a conductor produces a magnetic field 212. This is depicted in B of FIG. 2. Moreover, as can be appreciated by one of skill in the art after consideration of the present disclosure, magnetic fields 212 that are adjacent to one another can interact and cancel one another out along the midpoint between adjacent segments of the current path 208, as depicted by the dotted line 216. However, where the centroids of the adjacent current path 208 are displaced from one another, the area in which there is a suppression of magnetic fields 212 may not be sufficient. In addition, the magnetic field produced along the segment of the current path 208 connecting the two rows of solar cells 116 is not canceled. Accordingly, even with the suppression of the magnetic fields 212 provided by the illustrated configuration, the operation of nearby instruments may still be adversely affected.

Figure 3:
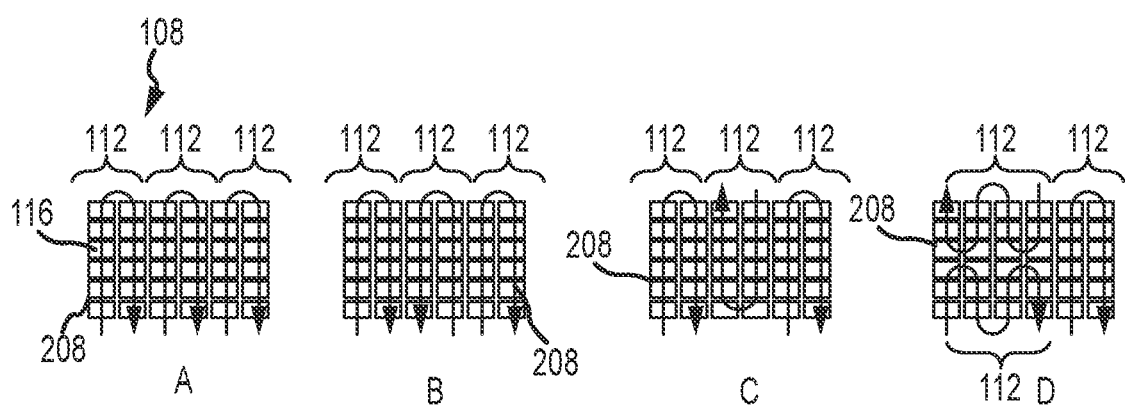
FIG. 3 depicts current paths and associated magnetic fields in solar cell arrays configured according to various exemplary configurations.

FIG. 3 depicts current paths having associated magnetic fields in solar panel assemblies 108 incorporating a plurality of solar cell arrays 112 according to various exemplary configurations. In each of the example solar panel assemblies 108, each of the included solar cell arrays 112 includes a set of solar cells 116 that are connected to one another in series. In each of these example configurations, the in-plane configuration of current paths 208 can provide at least partial cancellation of magnetic fields.

In A of FIG. 3, the solar panel assembly 108 includes six rows and six columns of solar cells 116. The solar panel assembly 108 includes three identical solar cell arrays 112 that each extend across two neighboring columns of solar cells 116. Moreover, the solar cells 116 are connected such that the current paths 208 extend up a first column of solar cells 116, and down a second column of solar cells 116 in each solar cell array 112. As can be appreciated by one of skill in the art, this configuration provides cancellation of generated magnetic fields along the midline of the two columns of solar cells 116 in each solar cell array 112. In addition, so long as the power supplied by each neighboring solar cell array 112 is the same, generated magnetic fields are canceled along the border of each neighboring solar cell array 112.

In B of FIG. 3, the solar panel assembly 108 is divided into three solar cell arrays 112 in a configuration that is similar to that of A of FIG. 3, except that the current path in the middle of the three solar cell arrays 112 travels up the second column of solar cells 116 in that subarray 112 and down the first column of solar cells 116. As can be appreciated by one of skill in the art, such a configuration provides cancellation only along the midline of columns of solar cells 116 within an individual solar cell array 112, not between neighboring solar cell arrays 112.

In C of FIG. 3, the solar panel assembly 108 is again divided into three solar cell arrays 112 that each include six rows and two columns of solar cells 116. However in this example the current entry and exit points for the first and third solar cell arrays 112 are along a bottom border of the solar panel assembly 108, while the current entry and exit points for the second or middle solar cell array 112 are along a top border of the solar panel assembly 108. Again, although cancellation of magnetic fields can be achieved along borders of columns of solar cells 116 included in individual solar cell arrays 112, cancellation of magnetic fields between neighboring solar cell arrays 112 is only achieved when the power supplied by the each of the neighboring solar cell arrays 112 is the same.

In D of FIG. 3, the solar panel assembly 108 is divided into three solar cell arrays 112. The first and second solar cell arrays 112 are arranged so that in the figure the first solar cell array 112 is disposed in the first and second rows and first through fourth columns of solar cells 116, and the second solar cell array 112 is disposed in the third and fourth rows and first through fourth columns of solar cells 116. The third solar cell array 112 is disposed adjacent the first and second solar cell arrays 112, and in the fifth and sixth columns and first through fourth rows of solar cells 116. As in other examples, cancellation of magnetic fields can be achieved along borders of columns of solar cells 116 within individual solar cell arrays 112, but cancellation of magnetic fields along borders of solar cells 116 in neighboring solar cell arrays 112 is only achieved when the power supplied by the individual solar cell arrays 112 is equal. Accordingly, alternate or additional techniques for reducing generated magnetic fields in a solar panel assembly 108 would be desirable.

Figure 4:
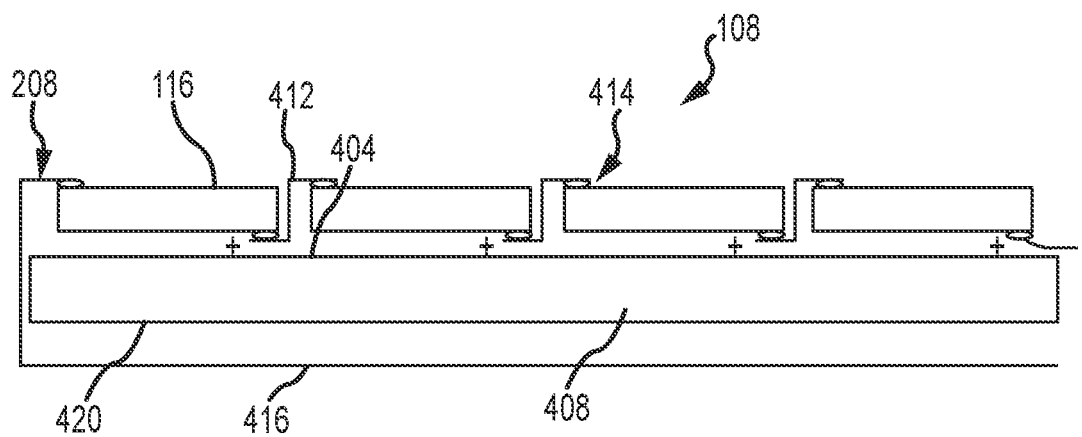
FIG. 4 is a cross-section view in elevation of a solar cell array with a return circuit configured according to an exemplary prior art configuration.

FIG. 4 is a cross-section view in elevation of a solar panel assembly 108 configured according to a typical prior art configuration. In this example, each of the solar cells 116 is placed on the first side 404 of a structural panel 408. The solar cells 116 are connected to one another in series by a number of wiring segments 412. Together, the internal current paths of the solar cells 116 and the wiring segments 412 form a supply circuit 414. A return circuit or wiring harness 416 extends across or on a second side 420 of the structural panel 408. A typical structural panel 408 is at least 20 mm thick. Accordingly, the return circuit 416 is necessarily spaced apart from the supply circuit 414 by at least that amount.

Figure 5:
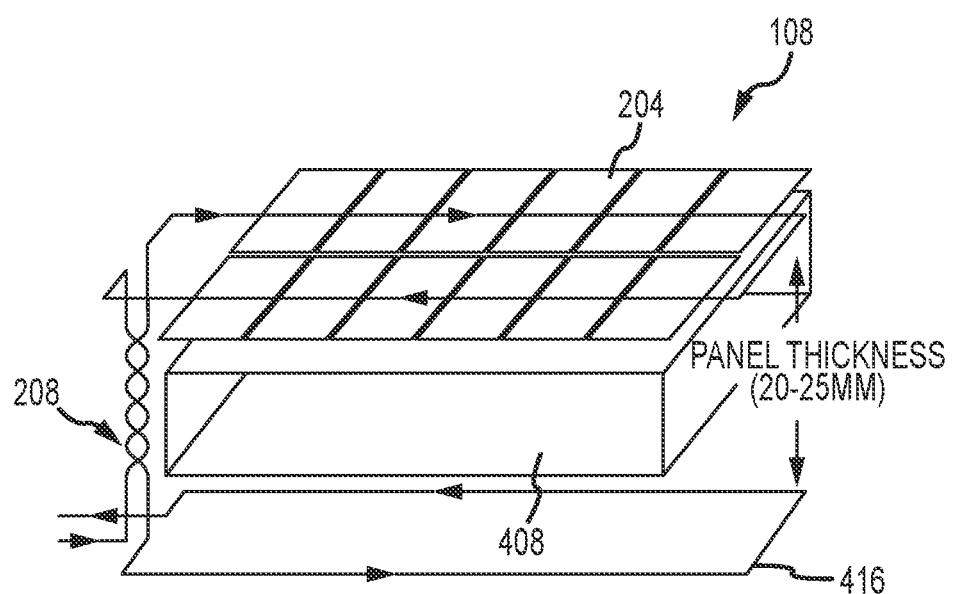
FIG. 5 depicts current paths in the example solar cell array of FIG. 4 in a perspective view.

FIG. 5 depicts an example of current paths in the solar panel assembly 108 of FIG. 4 in a perspective view. As shown, the wiring harness 416 portion of a current path 208 of the solar panel assembly 108 can be configured such that it mirrors the portion of the current path 208 defined by the solar cells 116 themselves. However, as can be appreciated by one of skill in the art, it is impractical to route a wiring harness 416 underneath the entirety of the current path 208 defined by the solar cells 116. In particular, a practical solar panel assembly 108 can have hundreds or even thousands of solar cells 116. Moreover, the individual solar cells 116 can be assigned to hundreds or thousands of solar cell arrays 112. Accordingly, attempting to route a wiring harness 416 on the second side 420 of the structural panel 408 so as to cancel magnetic fields generated within the current paths traversing the solar cells 116 on the first side 404 of the structural panel 408 requires a significant amount of additional wiring and manual labor. In addition, the thickness of the structural panel 408, which is typically 20 mm or greater, reduces the effectiveness of cancellation of magnetic fields that can be achieved through careful routing of the current path 208.

Figure 6A:
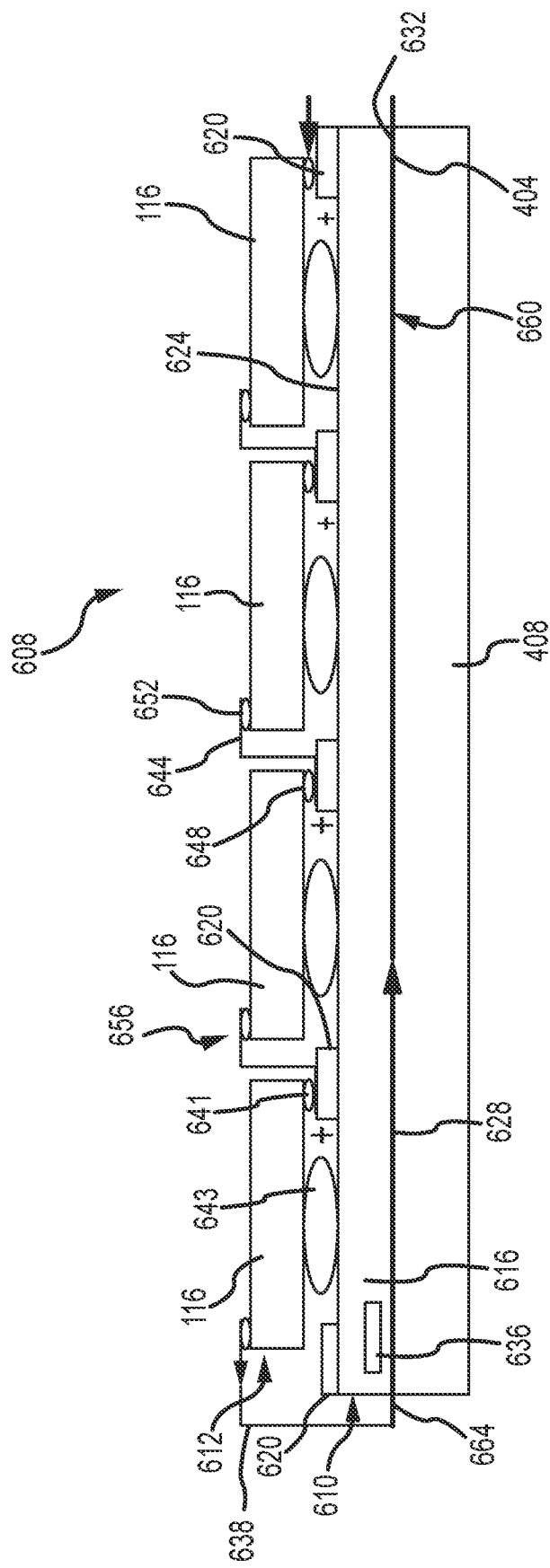
FIGS. 6A and 6B are cross-section views in elevation of solar cell arrays configured in accordance with embodiments of the present disclosure.
Figure 6B:
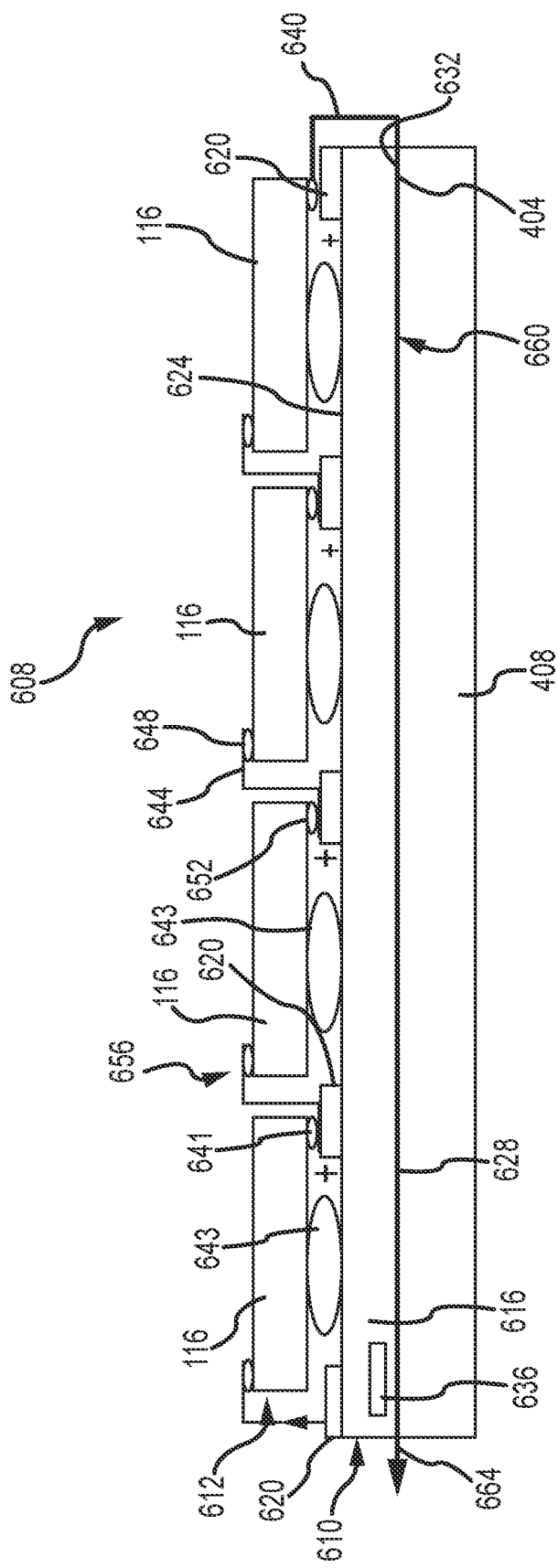

FIGS. 6A and 6B are cross-section views in elevation of solar panel assemblies 608 with one or more solar cell arrays 612 configured in accordance with embodiments of the present disclosure. In these figures, a single row of solar cells 116 is visible. However, each can have multiple rows of solar cells 116. The following discussion applies equally to both figures, except where otherwise noted.

In the solar panel assembly 608, solar cells 116 included in an array are joined to one or more multilayer circuit boards 610 located on the first side 404 of a structural panel 408. In accordance with at least some embodiments of the present disclosure, more than one solar cell 116 within a solar cell array 612 is mounted to a multilayer circuit board 610. In accordance with still further embodiments of the present disclosure, all of the solar cells 116 within a solar cell array 612 are mounted to a single multilayer circuit board 610. The multilayer circuit board 610 includes a non-conductive or dielectric substrate 616, with a first conductive structure or a first set of electrically conductive elements 620 at least partially disposed on a first surface 624 of the substrate 616 or partially on an intermediate layer 636 of the substrate 616, a second conductive structure or a second set of electrically conductive elements 628 on at least one of a second surface 632 of the substrate 616 or an intermediate layer 636 of the substrate 616, and one or more connecting segments 638 (FIG. 6A) or 640 (FIG. 6B) that can extend between one or more elements of the first set of electrically conductive elements 620 and one or more elements of the second set of electrically conductive elements 628.

As can be appreciated by one of skill in the art after consideration of the present disclosure, the first set of electrically conductive elements 620 can include elements formed in or from a conductive layer fixed to the first surface 624 side of the substrate 616, and the second set of electrically conductive elements 628 can include elements formed in or from a conductive layer fixed to the second surface 632 side of the substrate 616. Accordingly, the circuit board 610 can include, but is not limited to, a so-called "printed circuit board", a flexible polyimide with etched electrically conductive traces, a solid substrate with etched electrically conductive traces, a solid or flexible substrate with applied electrically conductive traces, or the like. As used herein, electrically conductive elements can include but are not limited to wirings joined to other electrically conductive elements, wirings joined to an input terminal 648 of a solar cell 116, wirings joined to an output terminal 652 of a solar cell 116, electrical conductive traces or features deposited on a surface of the substrate 616, electrically conductive traces or features etched or otherwise removed from a conductive layer bonded or otherwise fixed to the substrate 616, electrically conductive traces or features formed in an intermediate layer 636 of the substrate 616, mounting pads, and the like.

Individual solar cells 116 are mounted on the first surface 624 side of the circuit board 610 substrate 616, and are connected to one another by elements of the first set of electrically conductive elements 620 to define solar cell arrays 612. The solar cells 116 can be mounted to one or both of the first surface 624 of the substrate 616 and elements or features included in the first set of conductive elements 620. In the illustrated configuration, a wiring segment 644 provided as part of the first set of electrically conductive elements 620 extends between input 648 and output 652 terminals of solar cells 116 that are adjacent one another within the illustrated row, either directly or through another component of the first set of conductive elements 620, such as a trace or pad. However, as can be appreciated by one of skill in the art after consideration of the present disclosure, some or all of the connections between solar cells 116 within an array 612 can be completed entirely by conductive elements 620 in the form or traces formed on or that are integral to the circuit board 610. Each solar cell 116 can be joined to a trace, pad, or other element included in the first set of electrically conductive elements 620, for example through a soldered connection 641, a direct connection to, or a bond with the electrically conductive element. Alternatively or in addition, each solar cell 116 can be bonded or adhered to the first surface 624 of the substrate 616, for example using an adhesive 643. Moreover, a wiring segment or jumper wire 644 can be joined to another element in the first set of electrically conductive elements 620, the output terminal 652 of a solar cell 116, and/or the input terminal 648 of a solar cell 116. Together, the internal current paths of the solar cells 116 and elements of the first set of electrically conductive elements 620, including any wiring segments 644, form a supply or solar cell circuit 656.

The second set of electrically conductive elements 628 implements a return circuit or wiring harness 660. The wiring harness 660 generally carries an output current from the solar cell array 612 to which it is connected to a solar panel assembly 608 and/or a spacecraft 104 power distribution network for delivery to an electrical consumer or storage. Moreover, in accordance with embodiments of the present disclosure, the wiring harness 660 is configured to provide current paths that mirror those of the supply circuit 656. More particularly, current carried across a supply circuit 656 portion of a current path 664 through the solar cell array 612 is equal to and moves in an opposite direction from current in adjacent portions of the return circuit 660 portion of the current path 664. In accordance with embodiments of the present disclosure, the spacing between adjacent portions of the supply 656 and return 660 circuits is relatively small (e.g. 5 mm or less), at least in areas in which the supply circuit 656 is formed from elements of the first set of conductive elements 620 formed on or in the substrate 616. In particular, the spacing can be equal to the thickness of the substrate 616. Moreover, the spacing can be less than the thickness of the substrate 616 with respect to portions of the current path 664 formed in an internal layer 636 of the substrate 616. The spacing is slightly larger (e.g. 10 mm or less) in areas where the supply circuit 656 is formed from the solar cells; there the spacing is increased by the thickness of the portion of the solar cell 116 packaging or module separating conduction paths within the solar cell 116 from a surface of the solar cell 116 facing the first surface 624 side of the substrate 616, or in areas formed by jumper wires 644 that are disposed apart from the first surface 624 of the substrate 616.

The wiring harness 660 can be partially or entirely formed as etched or applied traces on the second surface 632 of the circuit board 610. In accordance with other embodiments of the present disclosure, some or all of the wiring harness 660 can be formed in one or more intermediate wiring or conductor layers 636 within the circuit board substrate 610, in addition or as an alternative to being formed on the second surface 632 of the circuit board substrate 616. A connecting segment 638 or 640 extends from an output terminal of the supply circuit 656 provided by an element of the first set of electrically conductive elements 620 on the first surface 624 side of the circuit board substrate 616 to an input terminal of the wiring harness 660 provided by an element of the second set of electrically conductive elements 628 on an intermediate layer 636 or on the second surface 632 of the circuit board substrate 616. The connecting segment 638 or 640 can be provided as a plated or filled through hole or via formed in the circuit board substrate 616, as plating on an edge of the circuit board 610, as an external wiring, or the like. Therefore, in at least some embodiments of the present disclosure, except for portions of the supply circuit 656 that are internal to the solar cells 116 themselves or that are provided by wiring segments 644, the current path 664 through the solar panel assembly 608 is provided by traces, vias and/or plating that are formed as integral elements of or that are directly connected to the circuit board 610. Moreover, all of the current path 664 through and adjacent the solar cells 116, including the wiring harness 660 portion of the current path 664 mirroring the supply circuit 656 portion of the current path 664, is entirely on the first side 404 of the structural panel 408. In accordance with at least some embodiments of the present disclosure, the second surface 632 of the circuit board 610 is bonded or mechanically fixed to a surface on the first side 404 of the structural panel 408. In accordance with further embodiments of the present disclosure, an operative array 612 of solar cells 116 disposed on a circuit board 610 can be provided without or separate from a structural panel 408.

Figure 7A:
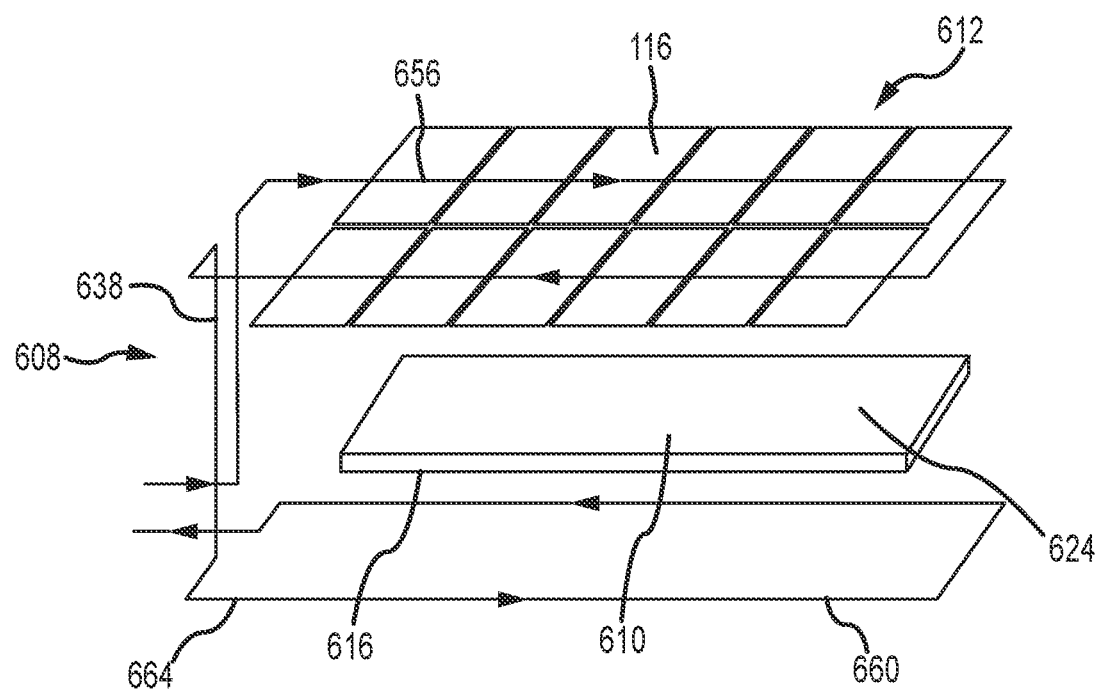
FIGS. 7A and 7B are depictions of current paths in the example solar cell arrays of FIGS. 6A and 6B respectively.
Figure 7B:
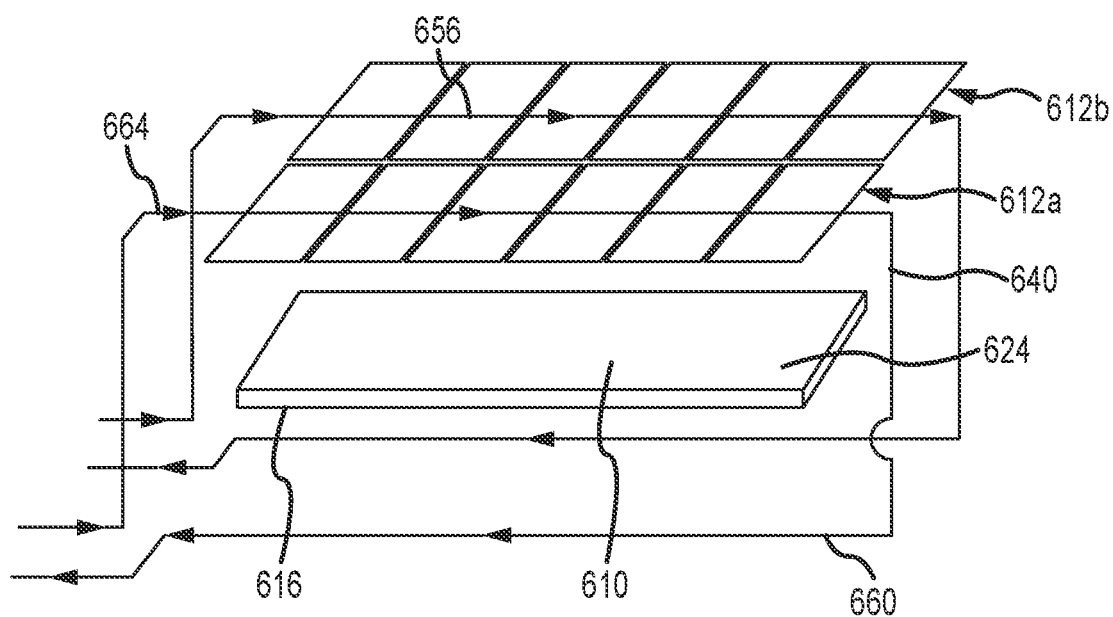

FIGS. 7A and 7B depict current paths 664 in the example solar cell arrays 612 illustrated in FIGS. 6A and 6B respectively, and show two rows of solar cells 116. In the example solar panel assembly 608 of FIGS. 6A and 7A, the solar cells 116 are mounted to a single circuit board 610 and are configured as part of a single solar cell array 612. In particular, the solar cells 116 are all connected in series, for example by the first set of electrically conductive elements 620 (see FIG. 6A), with current in the supply circuit 656 portion of the current path 664 travelling from left to right along a far row of solar cells 116, and travelling from right to left in the near row of solar cells 116. The return circuit or harness 660 portion of the current path 664 is formed by the second set of electrically conductive elements 628 (see FIG. 6A). The return circuit 660 is generally configured as a loop that mirrors the current path formed by the elements of the supply circuit 656 (e.g. the solar cells 116 and the first set of electrically conductive elements 620), and that carries current in an opposite direction from the direction of the current in the corresponding portion of the supply circuit 656. In the example solar panel assembly 608 of FIGS. 6B and 7B, the two rows of solar cells 116 are mounted to a single circuit board 610 that includes a single substrate 616. The two rows of solar cells 116 are configured as two separate solar cell arrays 612a and 612b disposed in parallel to one another. The portion of the return circuit 660 provided adjacent a given solar cell array 612a or 612b mirrors the supply circuit 656 portion for that array 612a or 612b, and carries current in an opposite direction from the direction of the current in the adjacent portion of the supply circuit 656. In addition, in both of these examples, although the various portions of the current path 664 are depicted as single lines, it should be appreciated that various supply circuit 656 portions and the return circuit 660 portions mirroring those supply circuit portions 656 can have multiple conductor elements in parallel to one another, and/or can have relatively complex circuit paths. As can be appreciated by one of skill in the art after consideration of the present disclosure, the supply 656 and corresponding return 660 circuits carry the same amount of current. This, in combination with the opposite and closely disposed routing of the supply 656 and return 660 circuits, provides for a reduced or entirely canceled apparent magnetic field in areas near the solar cell array 612.

In embodiments of the present disclosure, a distance between a supply circuit 656 portion of a current path 664, at least in portions formed by a first set of electrically conductive elements 620 on the first surface 624 of the circuit board substrate 616, and a wiring harness 660 portion of the current path 664, at least in portions formed by a second set of electrically conductive elements 628 on the second surface 632 of the circuit board substrate 616, can be equal to or about equal to a thickness of the circuit board substrate 616. Moreover, the spacing between such portions of the supply circuit 656 and the wiring harness 660 can be less than a thickness of the circuit board 610 or the included substrate 616, at least with respect to portions of one or both of the first 620 and second 628 sets of electrically conductive elements formed in one or more intermediate layers 636 of the circuit board 610. Moreover, a relatively close spacing between supply circuit 656 and wiring harness 660 portions of the current path 664 can also be provided with respect to portions of the supply circuit 656 formed by the solar cells 116 themselves. In particular, although the spacing between portions of the supply circuit 656 that are internal to the solar cells and the adjacent wiring harness 660 portions of the current path 664 is increased by the thickness of the package, substrate, or other components of the solar cells 116 located between the current carrying portions of the solar cells and the supply circuit 664, the typical spacing between such elements can remain relatively small (e.g. <7 mm).

In accordance with embodiments of the present disclosure, the spacing between at least portions of the supply circuit 656 formed by the first set of electrically conductive elements 620 and return 660 portions of the current path 664 formed by the second set of electrically conductive elements 628 is 5 mm or less. For example, where the thickness of a circuit board substrate 616 between the first set of electrically conductive elements 620 and the second set of electrically conductive elements 628 is about 2 mm, the supply circuit 656 and return circuit 660 portions respectively formed thereby can be placed at a distance that is about 2 mm from one another. In accordance with still other embodiments, a spacing between supply circuit 656 portions of the current path 664 formed by the first set of electrically conductive elements 620 and adjacent return portions 660 of the current path 664 mirroring the supply circuit portions 656 can be, for example, 1 mm, 0.5 mm, 0.2 mm, 0.1 mm, 0.05 mm, or 0.01 mm.

The reduced separation between the supply portion 656 of the current path 664 and the return circuit or wiring harness portion 660 of the current path 664, as compared to alternate configurations in which those portions are separated by the thickness of a structural panel 408, minimizes the magnitude of the magnetic field that is generated by operation of a solar cell array 612 as compared to those alternate solutions. In addition, by forming the return circuit or harness 660 portion of the current path 664 using traces on or within a circuit board 610, magnetic field cancellation at or within a circuit or subarray level becomes practical. Specifically, traces formed as part of the circuit board 610 can be routed to mirror the solar cell circuit supply portion 656 of the current path 664, to provide cancellation of generated magnetic fields. Moreover, by minimizing the distance between the harness portion 660 and the supply circuit 656 portion, cancellation of magnetic fields created by current in the current path 664 is improved as compared to alternate solutions in which a harness 416 portion is routed on a backside of a structural panel 408 by at least an order of magnitude. Furthermore, embodiments of the present disclosure eliminate the need to perform mission specific solar cell circuit layout to minimize magnetic field generation at the solar cell array level. Further advantages of embodiments of the present disclosure include reducing the change to solar cell array magnetic field characteristics in the event of a failure of one or more solar cells 116 or fluctuations in spacecraft 104 power demands. For example, the detailed circuit level mirroring provided by the wiring harness 660 as part of the circuit board 610 enables the provision of cancellation effects that directly correspond to individual solar cell 116 circuit paths.

Figure 8:
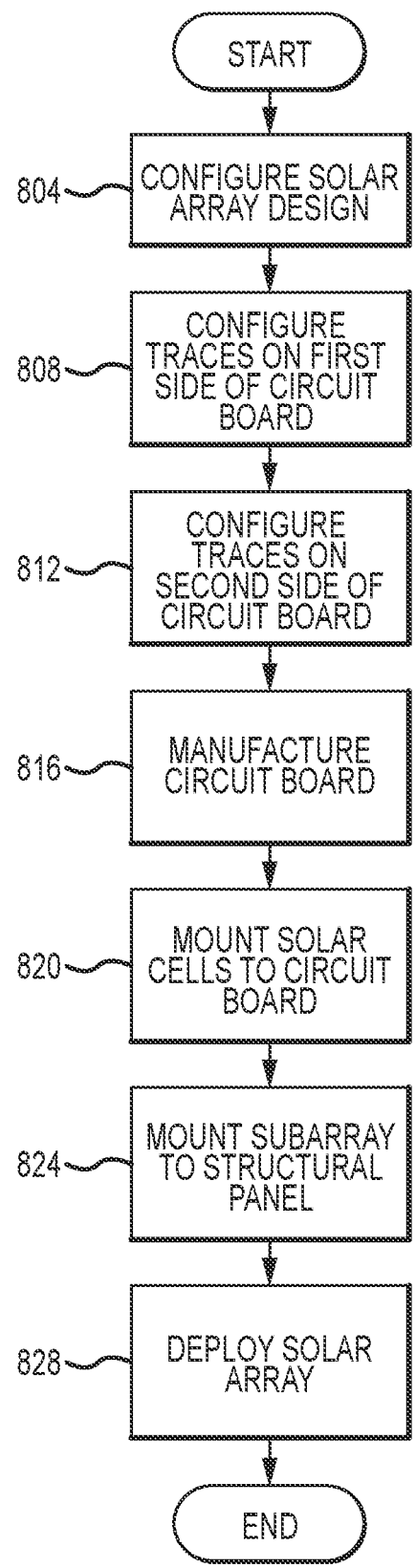
FIG. 8 is a flowchart depicting aspects of a method for providing a solar cell array having reduced magnetic fields in accordance with embodiments of the present disclosure.

FIG. 8 is a flowchart depicting aspects of a method for providing a solar panel assembly 608 having reduced magnetic fields in accordance with embodiments of the present disclosure. Initially, at step 804, a solar panel assembly 608 design is configured. In particular, the solar cell 116 type or types to be included in the assembly 608, the number of solar cells 116, the number of solar cell arrays 612, and the layout or configuration of the solar cells 116 within the solar cell arrays 612 are determined. These considerations will generally be driven by the anticipated power demands that the solar panel assembly 608 is intended to satisfy, packaging considerations, and the like. At step 808, traces on or adjacent the first surface 624 of the circuit board 610 for connecting solar cells 116 within one or more solar cell arrays 612 included in the solar panel assembly 608 design are configured. These traces can include various elements of a first set of electrically conductive elements 620, including conductor segments for connecting solar cells 116 in series, pads for electrically connecting the solar cells 116 to the conductor segments, pads for connecting wirings included in or forming wiring segments 644 to the traces on the first surface 624 of the circuit board 610, and the like. At step 812, traces on or adjacent the second side 632 of the circuit board 610 defining some or all of a harness or return circuit portion 660 of the current path 664 through the solar panel assembly 608 are configured. These traces can include various elements, including conductors forming current paths that mirror current paths through the solar cells 116 and the first set of electrically conductive elements 620, pads for connecting various elements included in or forming connection segments 640, and the like. In general, the harness portion 660 is configured to carry current equal to but in an opposite direction of current in an adjacent portion of the supply circuit 656, including in portions provided by the first set of electrically conductive elements 620 or in portions internal to the solar cells 116. Connection portions 640 for joining the supply circuit 656 and wiring harness portions 660 of the current path 664 can also be configured. The circuit board 610 and the included traces and any connection portions can then be manufactured (step 816). As can be appreciated by one of skill in the art, some or all of the traces, pads, vias and other components that are configured and manufactured in steps 808, 812, and 816 can be formed on a multilayered circuit board 610 using conventional automated manufacturing techniques.

The solar cells 116 can then be mounted to the first surface 624 of the circuit board 610 to form at least one solar cell array 612 (step 820). Contacts on the solar cells 116 can be directly connected to pads provided as part of the first set of electrically conductive components 620 located on the first surface 624 of the circuit board 610, and/or can be connected through wirings 644 that extend between contacts on the solar cells 116 and contacts formed on the first surface 624 of the circuit board 610. Moreover, the solar cells 116 can be connected to the circuit board 610 using automated pick and place operations. Connecting the solar cells 116 to the circuit board 610 can include soldering, bonding, or otherwise connecting contacts on the solar cells 116 to elements of the first set of electrically conductive components 620, and/or adhering, bonding, or otherwise connecting areas of the solar cells 116 to the first surface 624 of the circuit board substrate 616. Next, the circuit board 610, including the connected array of solar cells 116 and the integrated supply path 656, wiring harness 660, and connecting 640 portions, can be mounted to a support structure or panel 408 (step 824). The thus completed solar panel assembly 608 can then be integrated with a platform and deployed (step 828). Accordingly, embodiments of the present disclosure provide an operative solar panel assembly 608 that includes one or more solar cell arrays 612 that each include a plurality of solar cells 116, with at least portions of the associated current path 664, including portions joining adjacent solar cells 116 to one another, and including return harness 660 portions routed to provide magnetic field generation cancellation or mitigation, formed by conductive traces that are integral to a circuit board.

In accordance with embodiments of the present disclosure, one or more solar cell arrays 612 that each include a plurality of solar cells 116 mounted to a first surface 624 side of a single circuit board 610 configured as discussed herein can be configured as modules that are connected directly or via a support structure 408 to form a solar panel assembly 608. In accordance with further embodiments of the present disclosure, in addition to being structurally integrated, multiple solar cell arrays 612 can be electrically connected to one another. In accordance with still other embodiments of the present disclosure, an operative solar panel assembly 608 can include a single solar cell array 612 having a plurality of solar cells 116 and a single circuit board 610 configured as discussed herein. In accordance with still further embodiments of the present disclosure, an operative solar panel assembly 608 can include a plurality of solar cell arrays 612, each having a plurality of solar cells 116, and a single circuit board 610 configured as discussed herein. Moreover, embodiments of the present disclosure can provide operative solar cell arrays 612 that can be deployed without requiring a support structure 408.

The foregoing description has been presented for purposes of illustration and description. Further, the description is not intended to limit the disclosed systems and methods to the forms disclosed herein. Consequently, variations and modifications commensurate with the above teachings, within the skill or knowledge of the relevant art, are within the scope of the present disclosure. The embodiments described hereinabove are further intended to explain the best mode presently known of practicing the disclosed systems and methods, and to enable others skilled in the art to utilize the disclosed systems and methods in such or in other embodiments and with various modifications required by the particular application or use. It is intended that the appended claims be construed to include alternative embodiments to the extent permitted by the prior art.

What is claimed is:

1. A solar cell array, comprising:
   a structural panel;
   a circuit board substrate having a first surface and a second surface opposite the first surface, wherein the circuit board substrate is located on a first side of the structural panel;
   a plurality of solar cells disposed on a first surface side of the circuit board substrate, wherein a second surface side of the circuit board substrate faces the first side of the structural panel;
   a first conductor structure disposed on or in the circuit board substrate, wherein the first conductor structure electrically connects the solar cells to one another in series to form a solar cell array, and wherein the first conductor structure includes conductive elements formed in or from a first conductive layer fixed to the first surface side of the circuit board substrate; and
   a second conductor structure disposed on or in the circuit board substrate and closer to a second surface side of the circuit board substrate than the first conductor structure, wherein the second conductor structure includes conductive elements formed in or from a second conductive layer fixed to the second surface side of the circuit board substrate,
   wherein the first conductor structure and the plurality of solar cells define a first current path,
   wherein the second conductor structure defines a second current path,
   wherein at least some of the conductive elements of the second conductor structure mirror portions of the first current path defined by the plurality of solar cells,
   wherein a current through the at least some of the conductive elements of the second conductor structure that mirror portions of the first current path defined by the plurality of solar cells is equal to and in a direction opposite from a current through the portions of the first current path defined by the plurality of solar cells,
   wherein other of the conductive elements of the second conductive structure mirror portions of the first current path defined by the conductive elements of the first conductor structure,
   wherein a current through the other of the conductive elements of the second conductive structure that mirror portions of the first current path defined by the conductive elements of the first conductor structure is equal to and in a direction opposite from a current through the portions of the first current path defined by the conductive elements of the first conductive structure,
   wherein at least a portion of the first current path is separated from the second current path by at least a thickness of at least a portion of the circuit board substrate,
   wherein the first conductor structure includes at least a first conductive trace on the first surface of the circuit board substrate, and
   wherein the second conductor structure includes a second conductive trace on an intermediate layer of the circuit board substrate.

2. The solar cell array of claim 1, wherein a thickness of a portion of the circuit board substrate between the first conductive trace of the first conductor structure and the second conductive trace of the second conductor structure is from 0.001 mm to 1.0 mm.

3. The solar cell array of claim 1, wherein the second current path defined by the second conductor structure forms a return harness and is connected in series to the solar cell array.

4. The solar cell array of claim 1, wherein the first conductor structure includes a plurality of conductor segments.

5. The solar cell array of claim 1, wherein each solar cell in the plurality of solar cells includes an input terminal and an output terminal, wherein a first one of the input terminal and the output terminal is on a side of the solar cell facing the first surface side of the circuit board substrate, and wherein a second one of the input terminal and the output terminal is on a side of the solar cell facing away from the first surface side of the circuit board substrate.

6. The solar cell array of claim 5, wherein the first conductor structure includes a plurality of wiring segments, wherein each solar cell in the plurality of solar cells is associated with at least one of the wiring segments, wherein each wiring segment connects the first one of the input terminal and the output terminal of the associated solar cell to a portion of the first conductor structure formed on the first surface of the circuit board substrate.

7. The solar cell array of claim 1, wherein the circuit board substrate is a dielectric.

8. The solar cell array of claim 1, wherein the thickness of the circuit board substrate is between 0.01 mm and 5 mm.

9. The solar cell array of claim 1, wherein the thickness of the circuit board substrate is between 0.1 mm and 2 mm.

10. A solar panel, comprising:
a structural panel, wherein a thickness of the structural panel is greater than or equal to 20 mm; and
a plurality of solar cell arrays, each solar cell array including:
a circuit board substrate having a first surface and a second surface opposite the first surface, wherein the circuit board substrate is located on a first side of the structural panel, and wherein the circuit board substrate has a thickness that is less than or equal to 5 mm;
a plurality of solar cells disposed on a first surface side of the circuit board substrate;
a first conductor structure disposed on or in the circuit board substrate, wherein the first conductor structure electrically connects the solar cells to one another in series to form a solar cell array, and wherein the first conductor structure includes conductive elements disposed on the first surface of the circuit board substrate; and
a second conductor structure disposed on or in the circuit board substrate and closer to a second surface side of the circuit board substrate than the first conductor structure, wherein the second conductor structure includes conductive elements formed in or from a second conductive layer fixed to the second surface side of the circuit board substrate,
wherein the first conductor structure and the plurality of solar cells define a first current path,
wherein the second conductor structure defines a second current path,
wherein at least a portion of the first current path is separated from the second current path by at least a thickness of at least a portion of the circuit board substrate,
wherein a first segment of the first current path includes at least some of the solar cells in a first one of the solar cell arrays and at least portions of the first conductor structure,
wherein at least a first segment of the second current path mirrors the first segment of the first current path,
wherein a current in the first segment of the second current path is equal to a current in the first segment of the first current path,
wherein a direction of current flow in the first segment of the first current path is opposite a direction of current flow in the first segment of the second current path,
wherein the first conductor structure includes at least a first conductive trace on the first surface of the circuit board substrate, and
wherein the second conductor structure includes a second conductive trace on an intermediate layer of the circuit board substrate.

11. The solar panel of claim 10, wherein the second current path defined by the second conductor structure forms a return harness and is connected in series to the solar cell array.

12. The solar panel of claim 10, wherein the first conductor structure includes a plurality of conductor segments.

13. The solar panel of claim 10, wherein each solar cell in the plurality of solar cells includes an input terminal and an output terminal, wherein a first one of the input terminal and the output terminal is on a side of the solar cell facing the circuit board substrate, and wherein a second one of the input terminal and the output terminal is on a side of the solar cell opposite the circuit board substrate.

14. The solar panel of claim 10, wherein a spacing between elements of the first conductor structure and elements of the second conductor structure is less than 10 mm.

15. The solar cell array of claim 1, wherein for at least a first segment of the first current path opposite a first segment of the second current path a direction of current flow in the first segment of the first current path is opposite a direction of current flow in the first segment of the second current path,
wherein for at least a second segment of the first current path opposite a second segment of the second current path a direction of current flow in the second segment of the first current path is opposite a direction of current flow in the second segment of the second current path,
wherein the direction of current flow in the first segment of the first current path is opposite the direction of current flow in the second segment of the first current path, and
wherein the direction of current flow in the first segment of the second current path is opposite the direction of current flow in the second segment of the second current path.

16. The solar cell array of claim 15, wherein the first current path is part of a supply circuit, wherein the second current path is part of a wiring harness, wherein a connecting segment extends from an output terminal of the supply circuit to an input terminal of the wiring harness, and wherein the connecting segment includes a via formed in the circuit board substrate.

17. The solar cell array of claim 16, wherein the input terminal of the wiring harness is provided on an intermediate layer of the circuit board substrate.

18. The solar cell array of claim 1, wherein for at least a first segment of the first current path opposite a first segment of the second current path a direction of current flow in the first segment of the first current path is opposite a direction of current flow in the first segment of the second current path,
wherein for at least a second segment of the first current path opposite a second segment of the second current path a direction of current flow in the second segment of the first current path is opposite a direction of current flow in the second segment of the second current path,
wherein the direction of current flow in the first segment of the first current path is the same as the direction of current flow in the second segment of the first current path, and
wherein the direction of current flow in the first segment of the second current path is the same as the direction of current flow in the second segment of the second current path.

19. The solar cell array of claim 18, wherein the first segment of the first current path is joined to the first segment of the second current path by a first connecting segment, wherein the second segment of the first current path is joined to the second segment of the second current path by a second connecting segment, wherein the first connecting segment includes a first via formed in the circuit board substrate, and wherein the second connecting segment includes a second via formed in the circuit board substrate.

* * * * *